United States Patent
Lanni (10) Patent No.: US 7,142,423 B2
(45) Date of Patent: Nov. 28, 2006

(54) POWER ADAPTER WITH FAN ASSEMBLY

(75) Inventor: Thomas W. Lanni, Laguna Niguel, CA (US)

(73) Assignee: Comarco Wireless Technologies, Inc., Irvine, CA (US)

( * ) Notice: Subject to any disclaimer, the term of this patent is extended or adjusted under 35 U.S.C. 154(b) by 198 days.

(21) Appl. No.: 10/973,738

(22) Filed: Oct. 26, 2004

(65) Prior Publication Data

US 2006/0087815 A1    Apr. 27, 2006

(51) Int. Cl.
*H05K 7/20* (2006.01)

(52) U.S. Cl. ............ 361/695; 361/690; 361/719; 174/16.1; 174/16.3; 165/80.3; 165/104.33; 165/185

(58) Field of Classification Search ............ None
See application file for complete search history.

(56) References Cited

U.S. PATENT DOCUMENTS 5,150,278 A * 9/1992 Lynes et al. ............ 361/690
5,832,988 A * 11/1998 Mistry et al. ............ 165/103
6,101,090 A * 8/2000 Gates ............ 361/690
6,301,115 B1 * 10/2001 Hashimoto et al. ............ 361/704
6,487,074 B1 * 11/2002 Kimura et al. ............ 361/695
6,700,780 B1 * 3/2004 Hedberg et al. ............ 361/695
6,820,686 B1 * 11/2004 Yang et al. ............ 165/185
6,877,551 B1 * 4/2005 Stoller ............ 165/47
7,027,300 B1    4/2006 Lord ............ 361/695
7,065,173 B1 * 6/2006 Lacey et al. ............ 378/19
2004/0201973 A1 * 10/2004 Chiang et al. ............ 361/797

* cited by examiner

*Primary Examiner*—Boris Chervinsky
(74) *Attorney, Agent, or Firm*—Pillsbury Winthrop Shaw Pittman LLP (57) ABSTRACT

A power converter with a fan assembly cools down a temperature of the power converter. The power converter with a fan assembly includes a housing, a plate, and a second plate. The housing includes a fan assembly (which is integral to the housing) to draw in air. The plate is coupled to the housing to create an air channel between the plate and the housing and the second plated is coupled to the housing to create a second air channel between the second plate and the housing. The fan assembly draws in air through one of the air channel or the second air channel and moves air out through the other of the air channel and the second air channel to cool down the temperature of the power adapter.

14 Claims, 11 Drawing Sheets

POWER ADAPTER WITH FAN ASSEMBLY

BACKGROUND OF THE INVENTION

Power converters or power adapters, both DC/DC and AC/DC converters utilized for portable electronic devices, are being required to take up a smaller amount of space, as compared to current designs. In addition, the portable electronic devices powered by the power converters require more power in order to operate. Accordingly, the power converters or power adapters need to more efficiently supply power to the portable electronic devices.

As the power requirements of the portable electronic devices, usually measured in watts, continue to increase, cooling issues for the power adapters or power converters arise due to the increased operating temperature of the portable electronic devices. According to EN60950 regulations, the surface temperature of a portable electronic device that is handled by users or consumers should be below 85 degrees Fahrenheit. This allows the power converter or the power adapter to not run the risk of being too hot to a user's touch.

Internal temperatures, within the power adapter or power converter, are being generated in excess of the 85 degrees due to the increased power requirements of the power adapter or power converter. These higher temperatures not only create an increased device surface temperature, the higher temperatures may also lead to component degradation or malfunction. Currently, a reduction in internal temperature of the power converter, by external fins or other converter surface designs, for example, may result in an increase d surface temperature of the converter.

Accordingly, a need exists to be able to maintain the surface temperature of a power converter at a safe level and at the same time maintain the internal temperature at a level that does not damage internal components of the power converter or power adapter.

DETAILED DESCRIPTION OF THE INVENTION

Figure 1:
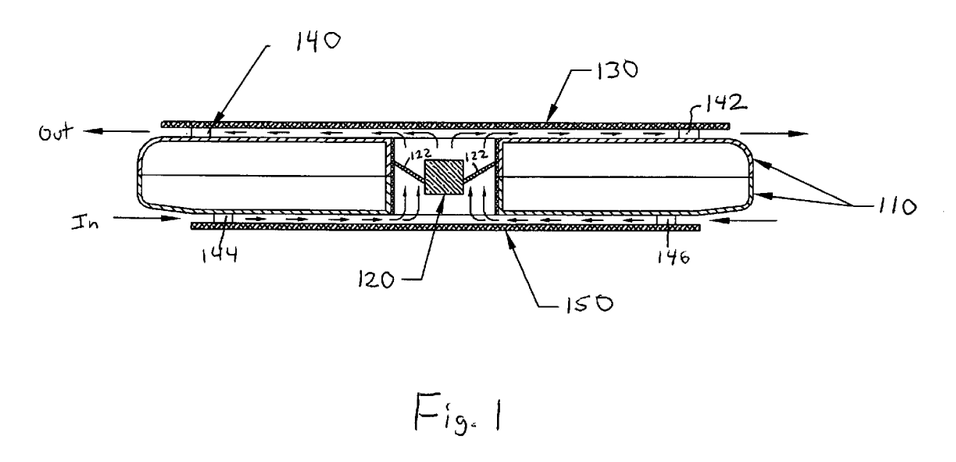
FIG. 1 illustrates a power converter according to an embodiment of the present invention.

FIG. 1 illustrates a power converter according to an embodiment of the present invention. The power converter includes a core housing 110, a cooling fan assembly 120, leads 122 for the cooling fan assembly, a top plate 130, and fasteners 140 142. In an embodiment of the invention, the power converter may include a bottom plate 150 and fasteners 144 146. The fasteners 140, 142, 144, 146 may be connected utilizing screws, nuts and bolts, adhesives, or plastic formed parts.

In an embodiment of the invention, the power converter 100 may include a plurality of fasteners for each of the bottom plate 150 and top plate 130, two fasteners 140 and 142 are illustrated for the top plate 130 and two fasteners 144 and 146 are illustrated for the bottom plate 150 in FIG. 1. In an embodiment of the invention, one fastener may be utilized to connect each of the top plate 130 and the bottom plate 150 to the adapter housing 110. In an embodiment of the invention, the fasteners 140 142 144 146 may be posts, e.g., cylindrical in shape, although other shapes may be utilized, e.g., square, rectangle, hexagon, etc. In an embodiment of the invention, a first number of fasteners may connect the top plate 130 and a second, different number of fasteners may connect the bottom plate 150 to the adapter housing 110. In an embodiment of the invention, fasteners may connect the top plate 130 to the adapter housing 110 in a different manner than the fasteners connect the bottom plate 150 to the adapter housing 110. For example, the top plate 130 may be connected to the adapter housing 110 utilizing an adhesive and the bottom plate 150 may be connected to the adapter housing 110 utilizing a screw.

In an embodiment of the invention, the core housing 110 of the adapter may include fins or louvers. In an embodiment of the invention including a plurality of fins and louvers, spaces may exist between the plurality of fins or louvers. In this embodiment of the invention, the space in between the plurality of fins or louvers may include openings, e.g., like a window screen which allows air to flow into and out of the core housing 110. In this embodiment of the invention, the top plate 130 and the bottom plate 150 may be attached, fastened, or connected to the fins or louvers of the core housing. The attachment may occur via any of the methods discussed above.

Figure 2A:
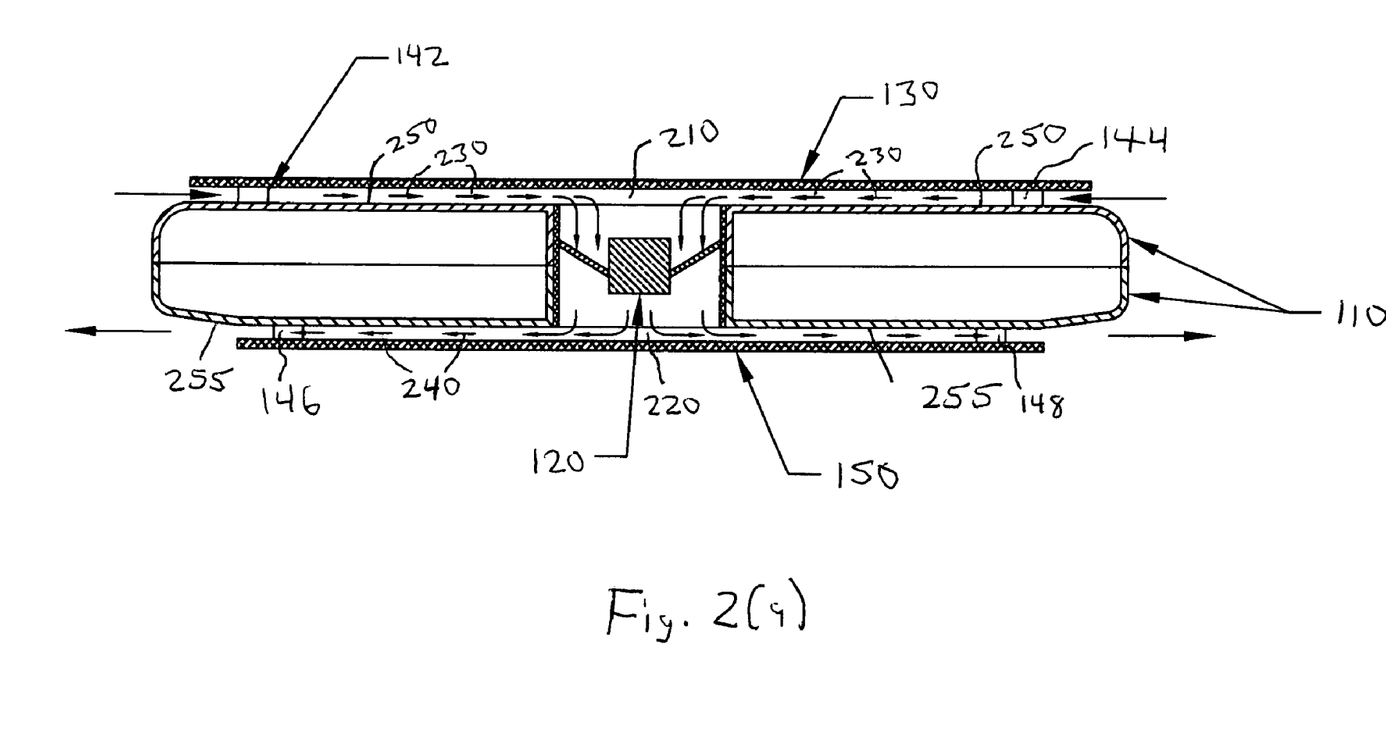
FIGS. 2(a), 2(b), 2(c), and 2(d) illustrate air flow in the power converter with a fan assembly according to an embodiment of the present invention.

FIGS. 2(a), 2(b), 2(c), and 2(d) illustrate air flow (see the arrows) in the power converter with fan assembly according to an embodiment of the present invention. FIG. 2(a) illustrates an airflow pattern when the air is drawn into a top air channel 210 and pushed out a bottom air channel 220. In this embodiment of the invention, the power converter with the fan assembly 100 includes a top plate 130, a bottom plate 150, at least one plate connector or fastener 142, 144, 146, and 148, a converter housing or core housing 110, and a fan assembly 120. The space created between the top plate 130 and the converter housing or core housing 110 creates a top air channel 210 or a top plenum 210. The space between the bottom plate 150 and the core housing 110 of the power converter 100 creates a bottom air channel 220 or bottom plenum 220.

Depending on the rotational direction (clockwise or counterclockwise) of the fan assembly 120, the fan assembly 120 may draw air into the top air channel 210. Air may be drawn in from both sides, in certain embodiments, as is illustrated by arrows 230. The air moves through the top air channel 210, past or through the fan assembly 120, and is directed, in this embodiment, to the bottom air channel or bottom plenum 220 where it exits as illustrated by arrows 240. The inclusion of the bottom plate 150 on the core adapter housing 110 directs the air flow through the bottom air channel 220 across the bottom surface of the core housing 100. The air flow across the power converter body or adapter core housing 110 cools down or reduces the bottom surface 255 temperature of the power converter body 110. In an embodiment of the invention, the passage of air across the power converter body 110 may cool down or reduce the surface temperature on the top surface 250 of the power converter body or core housing 110 by moving air across the top surface 250. Because the air across the top surface 250 of the power converter body 110 did not move past the fan assembly 120, the air may still be at a hot temperature.

Figure 2B:
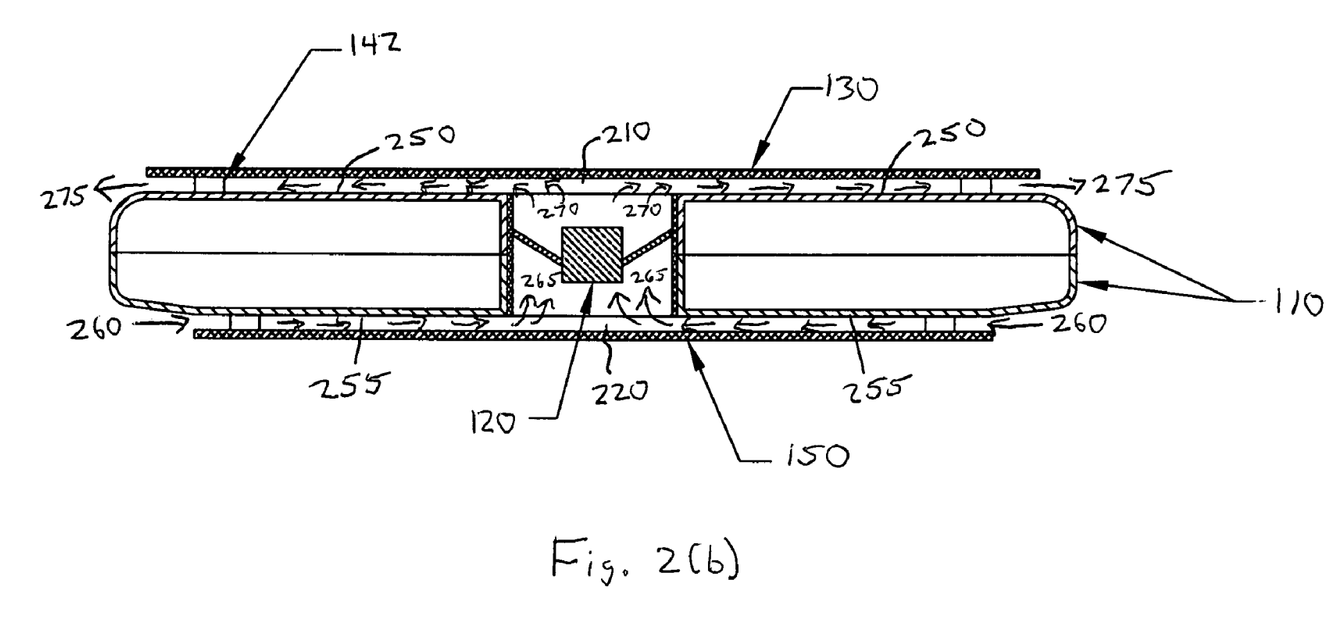

FIG. 2(b) illustrates an embodiment of the present invention where air is drawn into a bottom air channel, passes through a fan assembly, and exits out the top air channel. In the embodiment of the invention illustrated in FIG. 2(b), air is drawn in by suction or pull of the fan assembly 120 through an area between the bottom plate 150 and the power converter body or housing 110. This area may be referred to as a bottom air channel 220 or a bottom plenum 220. The air passes through the area surrounding the fan assembly 120 and is pushed out to the area, e.g., top plenum 210, between the top plate 130 and the power converter body or housing 110. The path of the air flow is indicated by arrows 260, 265, 270, and 275 (where 260 represents intake in the bottom air channel 220, arrows 265 and 270 illustrate air passage through the fan assembly 120, and arrow 275 illustrates air being exhausted out the top air channel 210). In the embodiment of the invention illustrated in FIG. 2(b), the movement of air in the top air channel 210 past the top surface 250 of the power converter body 110 results in a lowering of a temperature of the top surface 250 of the power converter body or adapter core housing 110. The movement of air in the bottom channel 220 may also slightly reduce the surface temperature on the bottom surface 255 of the power converter body 110.

Figure 2C:
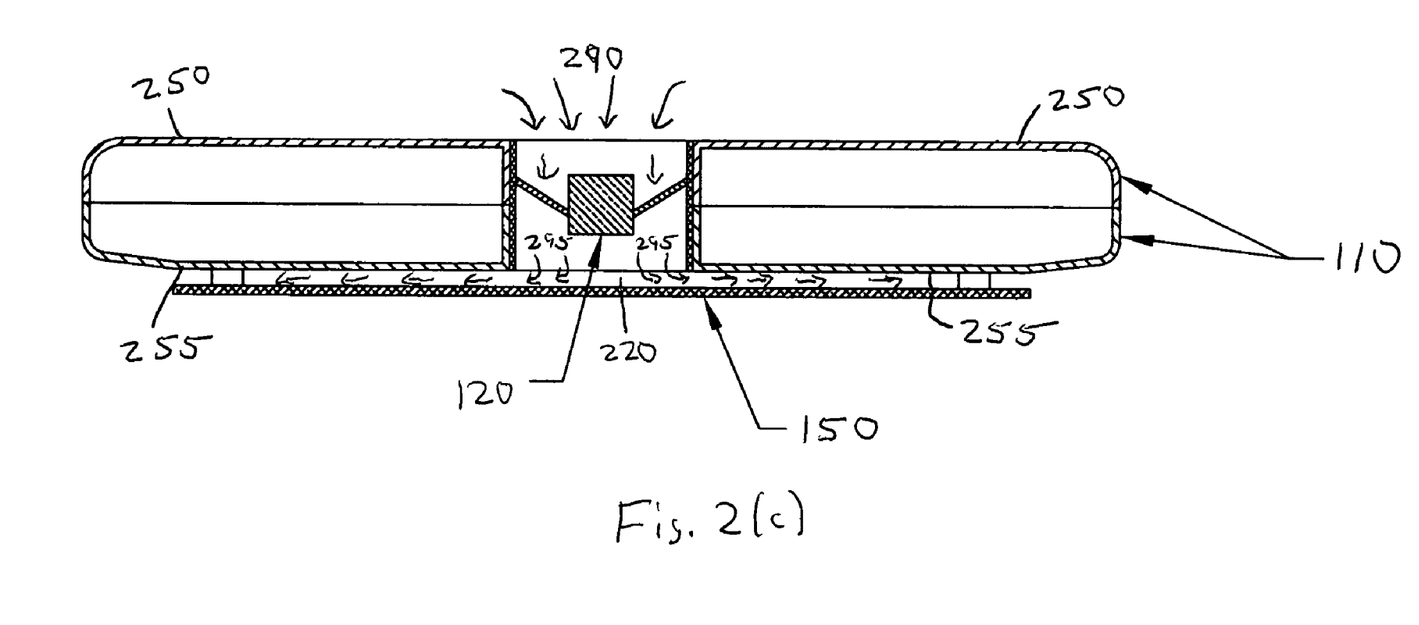

FIG. 2(c) illustrates an embodiment of the present invention where the power converter with a fan assembly only includes one plate. Although FIG. 2(c) illustrates only a bottom plate 150 being installed on the power converter, the discussion equally applies to an embodiment wherein the power converter with a fan assembly 100 includes only a top plate 130 coupled or connected to the power converter body 110. In the embodiment illustrated in FIG. 2(c), air is drawn from the top side of the power converter through the fan assembly 120 as illustrated by arrows 290. Because there is no top plate, for example, the air will be drawing in at the area in which the fan assembly 120 is located, as illustrated by the arrows 290 in FIG. 2(c). This results in the top surface 250 of the power converter body 110 not being cooled to the extent it would be if a top plate were present because no top air channel is created and there is little or no movement of air across the top surface 250 of the power converter body 110. The air is drawn through the fan assembly 120 and pushed out through the bottom air channel 220 as illustrated by arrows 295. As discussed above, this reduces the temperature of the bottom surface 255 of the power converter body 110.

Figure 2D:
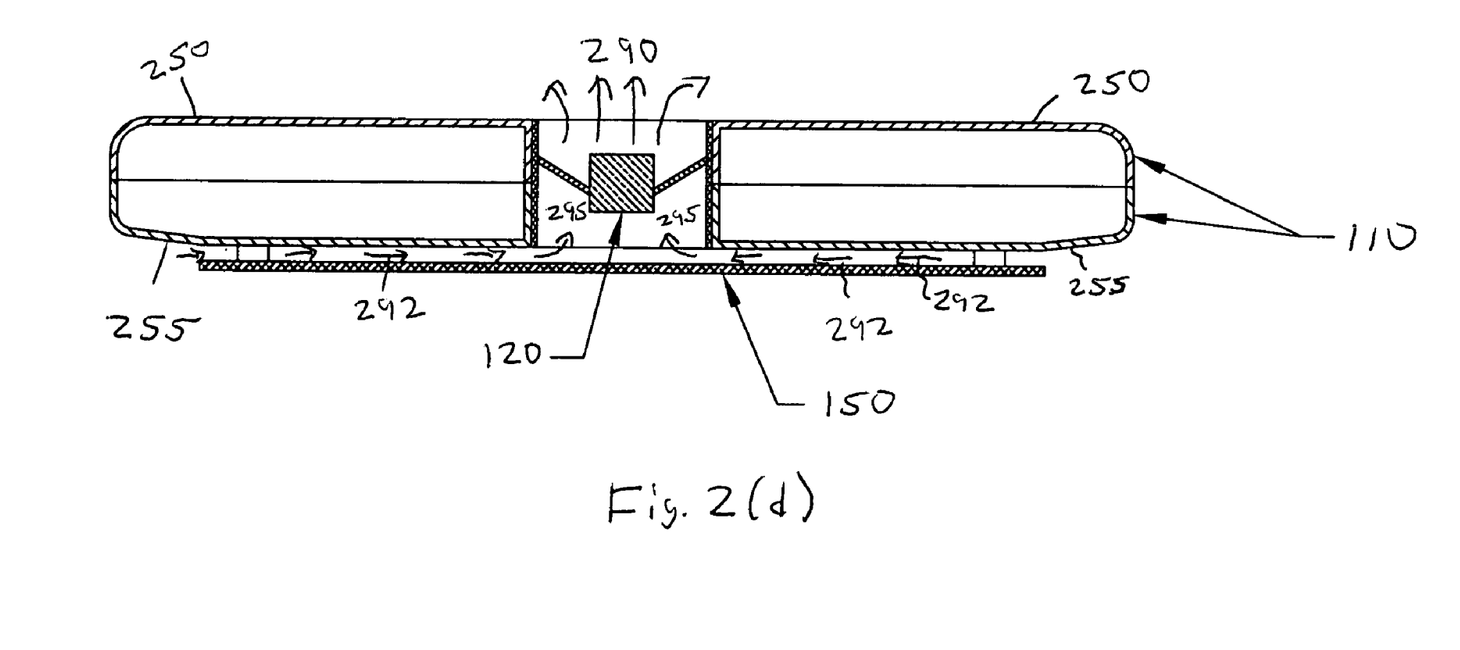

FIG. 2(d) illustrates air flow in a power converter with a fan assembly including one plate with an air flow opposite to that shown in FIG. 2(c). As noted above, FIG. 2(c) illustrates having only a bottom plate 150, but the discussion equally applies to an embodiment where the power converter with fan assembly includes only a top plate coupled to the power converter body. In the embodiment of FIG. 2(d), a fan in the fan assembly 120 is rotating in a direction opposite to the rotation of the fan in the embodiment of the invention illustrated in FIG. 2(c). In FIG. 2(d), the air is drawn into the bottom air channel 220, as illustrated by arrows 292. The air passes through the cutout where the fan assembly 120 resides and is pushed through the fan assembly 120, as is illustrated by arrows 295. The air is pushed out of the top of the power converter body 110 or adapter core housing 110, as is illustrated by arrows 290. The air being pushed out may cool a temperature of the top surface 250 of the power adapter body or core housing 110 and may cool a temperature of the bottom surface 255.

The adapter body or housing 110 may be made of a thermal insulating material. In an embodiment of the invention, the material is a thermal insulating plastic. In an embodiment of the invention, the plastic may be Lexan® 920. In an embodiment of the invention, the top plate 130 and the bottom plate 150 may also be made of a thermal insulating material. In an embodiment of the invention, the plastic may be Lexan® 920.

The power adapter with the fan assembly 100 is utilized to provide power to electronic devices, such as laptops, personal digital assistants, cellular phones, video games, etc. The power adapter with fan assembly 100 has a small space or footprint so as to be conveniently carried in laptop carrying cases, purses, small backpacks, a shirt pocket, a pants pocket, etc. The power adapter with the fan assembly 100 may receive power from an AC power source or a DC power source.

In an embodiment of the invention, the power adapter may be an AC power adapter with fan assembly 100 and in an embodiment of the invention, the power adapter may be a DC power adapter with fan assembly 100. The transformer section or the transformer assembly of the power adapter with fan assembly may include planar magnetics, which allows the power converter with fan assembly 100 to be slim. Illustratively, the transformer assembly's planar magnetics may be incorporated into a single layer circuit board or a multi-layer circuit board. Illustratively, the multi-layer circuit board may have four or more circuit boards soldered or coupled together. In an embodiment of the invention, the planar magnetics may be a separate assembly including a multi-layer circuit board, which attaches to the power adapter main circuit board. In an embodiment of the invention, the main circuit board of the power adapter with fan assembly 100 is a multi-layer circuit board and the transformer with planar magnetics is incorporated in the multi-layer circuit board. For discussion of such planar magnetic circuit boards, see U.S. Pat. Nos. 5,479,331 or 5,636,110, the disclosure of which are incorporated herein by reference.

Illustratively, the dimensions of an embodiment of power converter with fan assembly 100 are 5.3 inches long by 2.9 inches wide by 0.55 inches thick. In another embodiment of the invention, the power converter with fan assembly is 5.6 inches long, 2.3 inches wide and 0.68 inches thick. In another embodiment of the invention, the power converter with fan assembly 100 dimensions are 5.7 inches long by 3.3 inches wide by 0.68 inches thick.

In various embodiments of the power converter with fan assembly 100, the power converter dimensions may range from 4 inches long to 8 inches long, 2 inches wide to 5 inches wide, and from 0.50 inches thick to 1.0 inches thick. The size or width of the power converter with fan assembly 100 may depend on the power requirements of the electronic devices being powered by the power converter with fan assembly.

Figure 3:
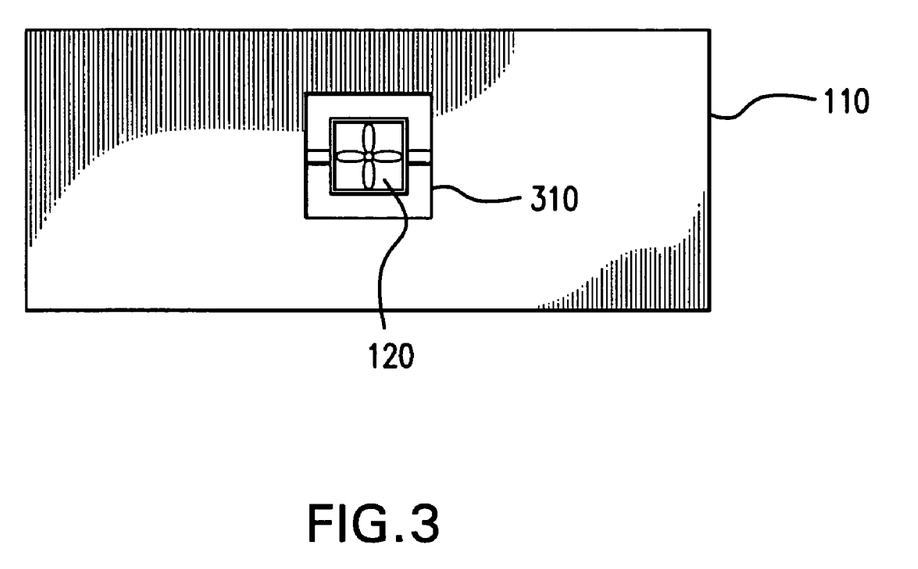
FIG. 3 illustrates a top view of the power converter including a fan assembly according to an embodiment of the invention.

FIG. 3 illustrates a top view of the power converter including a fan assembly according to an embodiment of the invention. The fan assembly 120 is a miniature or small fan. The dimensions of the fan assembly may be, illustratively, a 25 millimeter by 25 millimeter square. In embodiments of the invention, the fan assembly 120 may be other shapes, including but not limited to, a rectangle, a circle, a hexagon, or an octagon. In various embodiments of the invention, the fan assembly 120 dimension may range from a length of 15 to 50 millimeters and a width of 15 to 50 millimeters. The thickness of the fan assembly 120 may be less than the thickness of the power adapter or power converter body or core housing 110. In this manner, the fan assembly 120 does not interfere with, touch, or get close in proximity to the top plate 130 or the bottom plate 150 of the power converter with fan assembly 100.

In an embodiment of the present invention, the fan assembly cutout 310 may have a length of 30 millimeters and a width of 30 millimeters. In various embodiments of the invention, the dimensions of the cutout may range from a length of 15 to 50 millimeters to a width of 15 to 50 millimeters. In FIG. 3, the cutout 310 is illustrated as being located in the center of a horizontal axis and the center of a vertical axis of the power converter core housing 100. In embodiments of the invention, the fan assembly cutout 310 may be moved to other locations depending on the design layout of the main circuit board assembly for the power converter with fan assembly 100. For example, the fan assembly cutout 310 may be moved to the upper right area of the power converter core housing 110.

Figure 4:
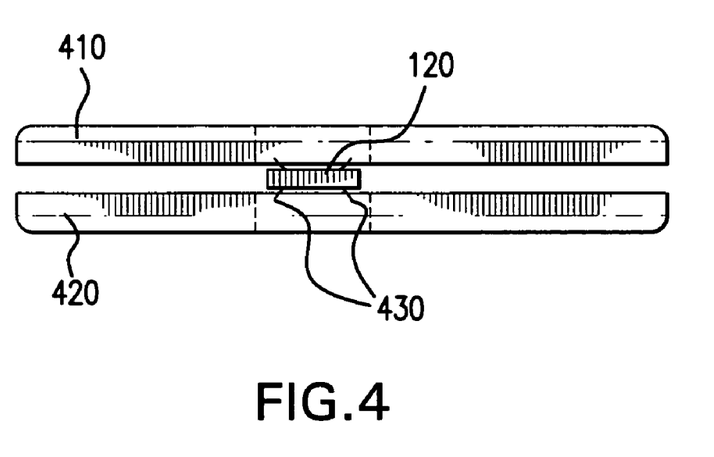
FIG. 4 illustrates a cross-section side view of coupling of a fan assembly to the adapter body according to an embodiment of the invention.

FIG. 4 illustrates a cross-section side view of the coupling of a fan assembly to the adapter body according to an embodiment of the invention. In an embodiment of the invention, a top adapter body portion 410 and a bottom adapter body portion 420 may connect together to form the power adapter core housing 110. In an embodiment of the invention, leads 430 for the fan assembly 120 may protrude from the top adapter body portion 410, e.g., from holes or openings in the top adapter portion, and reach to electrodes, connectors, or leads of the fan assembly 120. In an embodiment of the invention, leads 430 for the fan assembly 120 may exit holes in the bottom adapter body portion 420 or may exit holes from both the top adapter body portion 410 and the bottom adapter body portion 420. In an embodiment of the invention, the leads 430 may be covered by a protective coating to protect the wires from the surrounding environment and prevent electrical shorts.

Figure 5A:
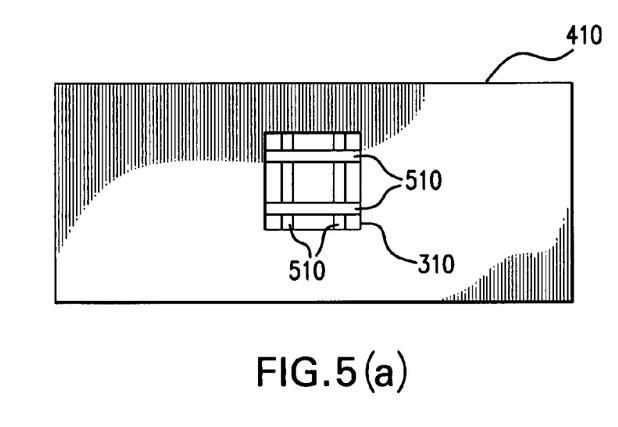
FIGS. 5(a) and 5(b) illustrate a top view of support structures for a fan assembly in a power converter body accordingly to an embodiment of the present invention.
Figure 5B:
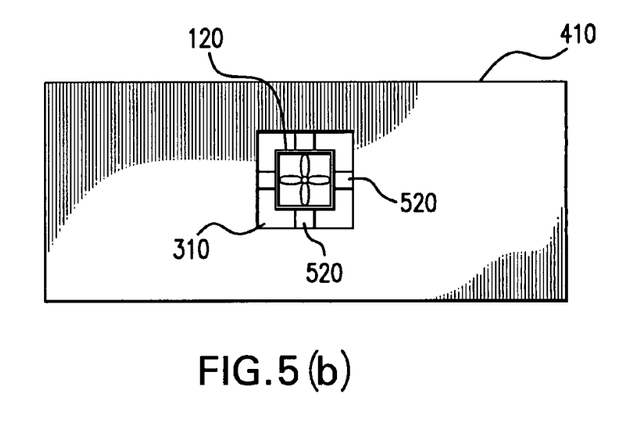

FIGS. 5(a) and 5(b) illustrate a top view of support structures for a fan assembly in a power converter body accordingly to an embodiment of the present invention. In an embodiment of the invention, additional support legs may run between the adapter body portions 410 and 420 and the fan assembly 120. FIG. 5(a) illustrates a grid-like structure with support legs 510 being provided in the horizontal and vertical directions (the fan assembly is omitted for ease of illustration). In the embodiment of the invention illustrated in FIG. 5(a), the fan assembly 120 may be adhesively coupled to the grid structure. In an embodiment of the invention, the fan assembly 120 may be pressed between a grid-like structure of the adapter body top portion 410 and a similar grid-like structure of the adapter body bottom portion 420. The additional support legs 510 may be formed from plastic or other similar materials.

FIG. 5(b) illustrates a top view of a power converter with fan assembly where support legs may run from an edge of the cutout to the fan assembly. In the illustrated embodiment, the support legs 520 may run from one edge of the cutout 310 to an edge of the fan assembly 120. In this embodiment of the invention, the fan assembly 120 may be coupled to the support legs 520. In an embodiment of the invention, two support legs may be utilized. In the embodiment of the invention illustrated in FIG. 5(b), four support legs 520 are utilized.

Figure 5C:
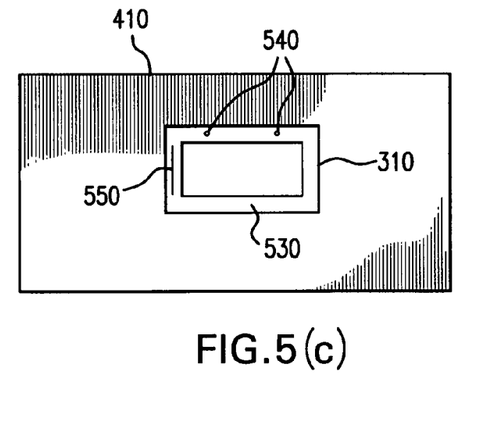
FIG. 5(c) illustrates a top view of a bottom portion of a power converter with a fan assembly according to an embodiment of the invention.

FIG. 5(c) includes a top view of a bottom portion of a power converter with fan assembly according to an embodiment of the invention. In an embodiment of the invention, the top adapter body portion 410 may include a ledge 530 and the bottom adapter body portion 420 may include a ledge 530. In embodiments of the invention, each of the top adapter body portion 410 and the bottom adapter body portion 420 may include one, two, or four ledges. FIG. 5(c) illustrates a power converter with fan assembly including four ledges 530. In an embodiment of the invention, the ledges 530 on the top 410 and the bottom adapter body portions 420 may be opposite to each other. In embodiments of the invention utilizing the ledge 530, the ledges 530 may be formed so as to support the fan assembly 120. In other words, a top portion of the fan assembly 120 may rest against a top ledge of the top 410 adapter body portion and a bottom portion of the fan assembly 120 may rest against a bottom ledge 530 of the adapter bottom body portion 420. In this embodiment of the invention, the ledges 530, which may be opposing each other may press against the fan assembly 120 which keeps the fan assembly 120 from moving during operation of the fan assembly 100.

In an embodiment of the invention, the ledges 530 may include mating mechanisms. In an embodiment of the invention, one of the ledges 530 (the top ledge or the bottom ledge) may include a post or tab, illustrated as 540 in FIG. 5(c), or one of the ledges 530 may include a ridge, illustrated as 550 in FIG. 5(c). The opposing ledge (the bottom ledge or the top ledge) may include a corresponding hole or detent to receive the associated post/tab 540 or ridge 550. In an embodiment of the invention, one ledge may have a post 540 and another ledge may have a ridge 550, as is illustrated in FIG. 5(c), or all ledges 530 may have the same mating mechanism.

The cooling fan assembly 120 may be a device manufactured by ADDA USA Corporation of Brea, Calif., e.g., ADDA model number 12MX-K50 or 12MX-G50. A circuit board on the power adapter may communicate with the cooling fan assembly 120 via a two-wire interface. In other words, a power line and a ground line may supply signals to the cooling fan assembly 120 in order to supply on and off signals to the cooling fan assembly 120. The power line may provide the cooling fan assembly 120 with, for example, +3.3 volts, +5 volts, or 12 volts, or other voltages, depending on the application requirements. In an embodiment of the invention, a communication protocol such as Universal Serial Bus (USB) or I2C may be utilized to communicate with the cooling fan assembly 120.

The operation of the fan assembly 120 in the power converter 100 may be controlled in a number of ways. In embodiments of the invention, the fan assembly 120, once activated, may maintain a single speed. In other words, the fan assembly 120 has two states, on and off. In embodiments of the invention, a fan speed of the fan assembly 120 may be varied, depending on power converter conditions, as discussed below. In these embodiments of the invention, the fan speed may be varied by varying an input DC voltage or by varying a pulse width of an input signal of the fan assembly 120.

Illustratively, in the embodiments where a fan assembly 120 maintains one fan speed, if the power adapter 100 receives an AC voltage input or DC voltage input, the fan assembly 120 may be powered on. In this embodiment of the invention, circuitry may also be added to introduce a delay from when the power is applied to the power converter and when the fan assembly 120 is activated. In these embodiments of the invention, the fan assembly 120 may remain in operation or activated until the power adapter or power converter 100 is no longer receiving power from either the AC voltage source or DC voltage source.

FIG. 6(*a*) illustrates a current fan control circuit in a power converter with fan assembly according to an embodiment of the present invention. In an embodiment of the invention, a current fan control circuit 600 may be included in the power adapter with fan assembly 100. The current fan control circuit 600 may measure the output current of the power converter 100 with fan assembly. In an embodiment of the invention, if the output current of the power adapter with fan assembly is above or equal to a current threshold established and stored in the fan control circuit 600, the fan control circuit 600 may transmit a signal to turn on or activate the fan assembly 120. In an embodiment of the invention, the fan control circuit 600 sends the signal directly to the fan assembly 120. In an embodiment of the invention, the fan control circuit 600 transmits a signal to a fan driver 610 to turn on or activate the fan assembly 120. Conversely, if the output current of the power adapter falls below a current threshold, the fan control circuit 600 may turn off or deactivate the fan assembly 120. In an embodiment of the invention, the fan assembly 120 may continue to run after it has been activated by the fan control current circuit 600 until the power adapter is no longer receiving power. In this embodiment, the current control circuit 600 is utilized to activate the fan assembly 120, but is not utilized to turn off or deactivate the fan assembly 120.

FIG. 6(*b*) illustrates a-power converter with fan assembly utilizing a temperature control circuit according to an embodiment of the present invention. In an embodiment of the invention, a temperature fan control circuit 630 may be included in the power adapter with fan assembly 100. The temperature fan control circuit 630 may include a temperature sensor 640, e.g., a thermistor, to measure a temperature in a location surrounding the temperature sensor. In an embodiment of the invention, the location may be determined by the placement of the highest heat-generating components. For example, if a transformer or Field Effect transistors generate the most heat in the power adapter with fan assembly 100, the temperature sensor 640 may be placed near these components. If the temperature sensor 640 measures a temperature above a temperature threshold, the temperature fan control circuit 630 may turn on or activate the fan assembly 120. In an embodiment of the invention, the temperature fan control circuit 630 may send an activation signal to a driving circuit 650 for the fan assembly 120 instructing the fan assembly 120 to turn on or activate the fan. Conversely, if the temperature falls below the temperature threshold, the temperature fan control circuit 630 may turn off or deactivate the fan assembly 120.

In embodiments of the invention where the fan speed is varied by changing or varying a pulse width of an input signal, a pulse width modulation circuit may be utilized to adjust the speed of the fan, depending on power converter conditions. The pulse width modulation circuit may use a train of low-frequency pulses to power or activate the fan assembly 120. Illustratively, if the pulse width is increased, the fan assembly control circuit may transmit a signal to the fan assembly to increase the fan speed. If the pulse width is decreased, the fan assembly or fan assembly control circuit may transmit a signal to the fan assembly to decrease the fan speed.

FIG. 6(*c*) illustrates driving of a fan assembly utilizing a current sensor and a pulse width modulation circuit. In an embodiment of the invention utilizing a pulse width modulation circuit in the power converter, the pulse width modulation circuit 670 may receive an input from a fan control circuit 665, which may or may not receive an input from a current sensor 660. In an embodiment of the invention, the pulse width modulation circuit 670 may receive an input directly from a current sensor 660.

Figure 6A:
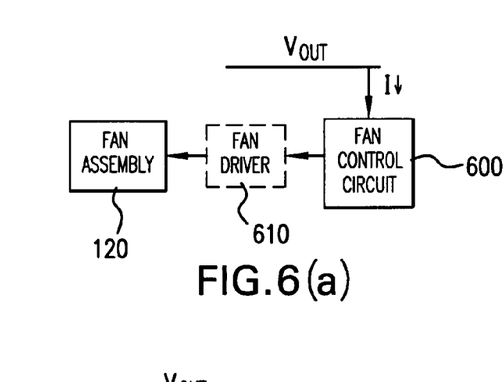
FIG. 6(a) illustrates a current fan control circuit in a power converter with a fan assembly according to an embodiment of the present invention.
Figure 6B:
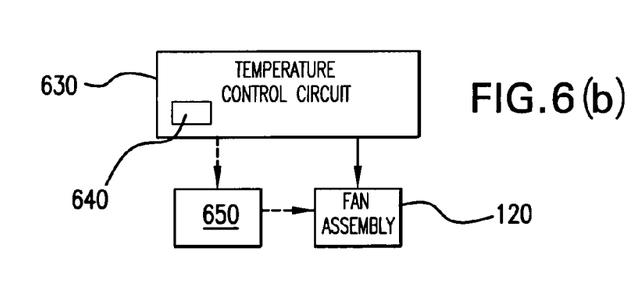
FIG. 6(b) illustrates a power converter with a fan assembly utilizing a temperature control circuit according to an embodiment of the present invention.
Figure 6C:
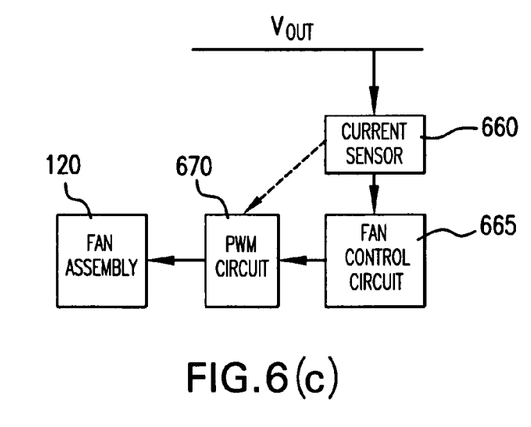
FIG. 6(c) illustrates driving of a fan assembly utilizing a current sensor and a pulse width modulation circuit according to an embodiment of the present invention.

In an embodiment of the invention utilizing a current sensor 660 coupled to the pulse width modulation circuit 670, the current sensor 660 may read or monitor an output current (of the power converter) periodically or on a continuous basis. The current sensor 660 may transmit a current level to the pulse width modulation circuit 670. Based upon the current reading, the pulse width modulation circuit 670 may adjust a duty cycle of a driving signal that drives the fan assembly 120. In an embodiment of the invention, the pulse width modulation circuit 670 may not transmit a signal at all to the fan assembly 120 if a specific threshold of the output current has not been met. For example, the pulse width modulation circuit 670 may have a threshold of 1.4 amps for the output current. If the measured power adapter current becomes 1.4 amps, or greater, as measured by the current sensor 660, then the pulse width modulation circuit 670 may activate the fan assembly 120.

If the power adapter current becomes 2.0 amps, for example, the pulse width modulation circuit 670 may modify the pulse width of the driving signal to the fan assembly 120 to increase the fan speed. If the power adapter current decreases, for example, from 2.0 amps to 1.8 amps, the pulse width modulation circuit 670 may modify the pulse width of the driving signal to the fan assembly 120 to decrease the fan speed.

FIG. 6(*d*) illustrates driving of a fan assembly utilizing a temperature sensor and a pulse width modulation circuit. In an embodiment of the invention, the pulse width modulation circuit 670 may receive an input directly from a temperature sensor 680.

Figures 6D, 6E:
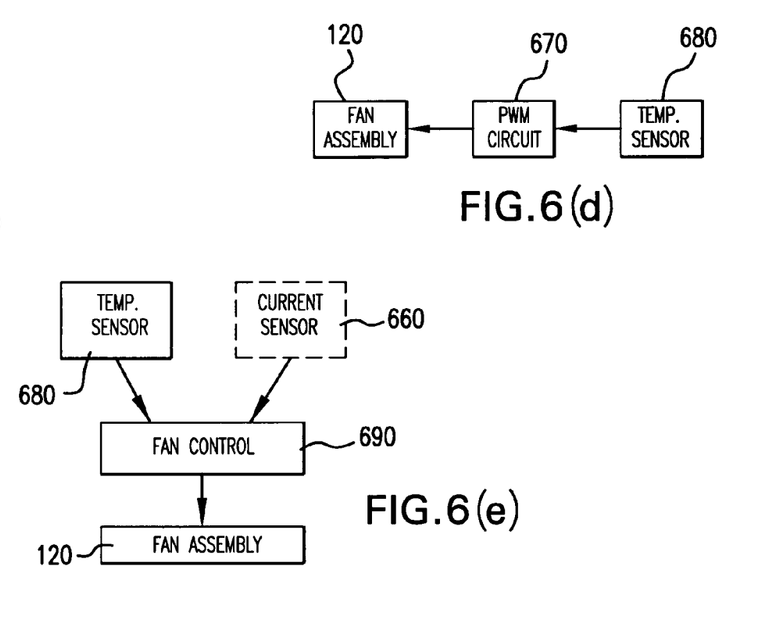
FIG. 6(d) illustrates driving of a fan assembly utilizing a temperature sensor and a pulse width modulation circuit according to an embodiment of the present invention.
FIG. 6(e) illustrates a temperature sensor or a current sensor and a fan control circuit driving a fan assembly according to an embodiment of the present invention.

In an embodiment of the invention utilizing a temperature sensor 680 coupled to the pulse width modulation circuit 670, the temperature sensor 680 may read or monitor a temperature of the power converter (either an internal temperature and/or a surface temperature) periodically or on a continuous basis. The temperature sensor 680 may transmit a temperature reading to the pulse width modulation circuit 670. Based upon the temperature reading, the pulse width modulation circuit 670 may adjust a duty cycle of a driving signal that drives the fan assembly 120. In an embodiment of the invention, the pulse width modulation circuit 670 may not transmit a signal at all to the fan assembly 120 if a specific threshold of the temperature has not been met. For example, the pulse width modulation circuit 670 may have a temperature threshold of 78 degrees Fahrenheit. If the power adapter temperature is equal to or greater than 78 degrees, as measured by the temperature sensor 670, then the pulse width modulation circuit 670 may activate the fan assembly 120. The activating of the fan assembly 120 may lead to a cooling of the power adapter temperature (surface or internal). If the power adapter temperature continues to increase, for example, becomes 85 degrees, the pulse width modulation circuit 670 may modify the pulse width of the driving signal to the fan assembly 120 to increase the fan speed. If the power adapter temperature decreases, for example, from 85 degrees to 81 degrees the pulse width modulation circuit 670 may modify the pulse width of the driving signal to the fan assembly 120 to decrease the fan speed.

FIG. 6(e) illustrates a temperature sensor or a current sensor and a fan control circuit according to an embodiment of the present invention. In an embodiment of the invention, a fan control circuit may vary an input voltage to the fan assembly 120, which in turn decreases or increases a rotation speed of the fan assembly 120. In this embodiment of the invention, a current sensor 660 or a temperature sensor 680 may transmit a reading to the fan control circuit 690. The fan control circuit 690 can vary the input voltage to the fan assembly 120 to, for example, increase the fan speed. Illustratively, the increase in the fan speed may result in a decrease or a stabilization of the temperature of the power converter or power adapter 100. Similarly, a fan control circuit 690 can vary the input voltage, e.g., decrease the input voltage, to decrease the fan speed. This may result in a decrease or stabilization of the temperature of the power converter or power adapter 100.

Figure 7:
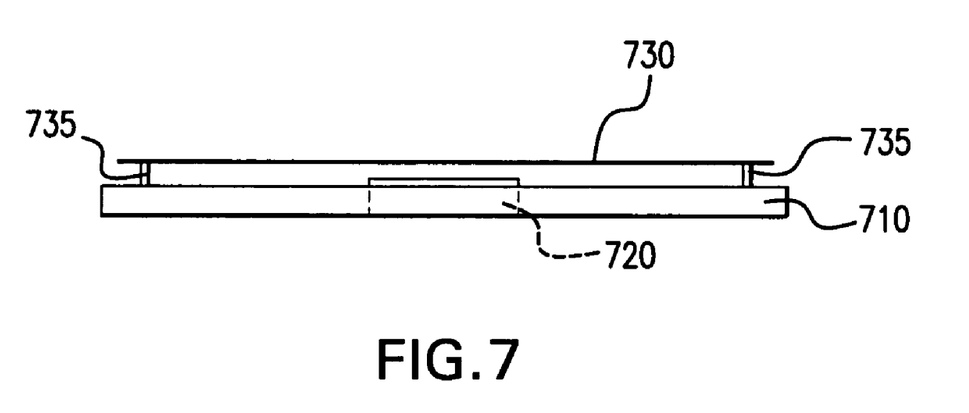
FIG. 7 illustrates a cross-sectional side view of a circuit board including a fan assembly with a cover assembly or core housing according to an embodiment of the present invention.

FIG. 7 illustrates a cross-sectional side view of a circuit board including a fan assembly with a cover assembly or core housing according to an embodiment of the present invention. The power adapter 100 includes an outer casing 110, a top plate 130, and a bottom plate 150, which are not shown in FIG. 7. The adapter core or adapter body may include a circuit board 710, a fan assembly 120, and at least one heat dissipating device 730. The heat dissipating device 730 may be a heat sink. In an embodiment of the invention, the at least one dissipating device 730 may be attached or connected to the circuit board 710. Illustratively, the at least one dissipating device 730 may be coupled or connected to circuit board 730 on a side opposite to the side where the at least one dissipating device 730 is located. In other words, a portion of the at least one dissipating device 730 may be wrapped around to a top surface of the circuit board 710, if the heat dissipating device 730 is positioned below the circuit board 710. In this embodiment, the heat dissipating device 730 may reach around and clasp around the side of the circuit board 710. In embodiments of the invention, the dissipating device 730 may be connected to the circuit board 710 by a fastener 735 such as a screw, a clasp, or a clamp, as illustrated by FIG. 7.

In an embodiment of the invention, the heat dissipating device 730 may run across an area approximately equal to the circuit board 710, as illustrated in FIG. 7. In an embodiment of the invention, the heat dissipating device 730 may only cover specific areas of the circuit board 710. In embodiments of the invention, multiple heat dissipating devices 730 may be coupled to specific sections of the circuit board. In one embodiment of the invention, the heat dissipating device 730 may be made of a high strength thermal insulator. In an embodiment of the invention, the heat dissipating device 730 may be made of a plastic sheet and an aluminum sheet to dissipate the heat evenly or in a more regular manner from high heat areas such as transformers and FETs.

In an embodiment of the invention, the heat dissipating device 730 may encompass an area where the highest number of heat generating devices is located. For example, if power factor control circuitry and power conversion circuitry generate the highest heat in the power adapter with fan assembly, then the heat dissipating device(s) 730 may be coupled to the circuit board 710 in these associated area(s). In an embodiment of the invention, a heat dissipating device 730 or a plurality of heat dissipating devices 730 may be attached or coupled to the components in the power conversion circuitry or the power factor control circuitry generating the most heat. For example, the FETs/FET drivers in the power factor control circuitry may generate the most heat and, thus, may have heat sinks or heat dissipating devices 730 attached to them. In an embodiment of the invention where heat dissipating devices are attached to the components, an additional heat dissipating sheet may be attached to the heat dissipating devices to spread out the heat across the circuit board 710 and hence-the power adapter with fan assembly 110.

Figure 8:
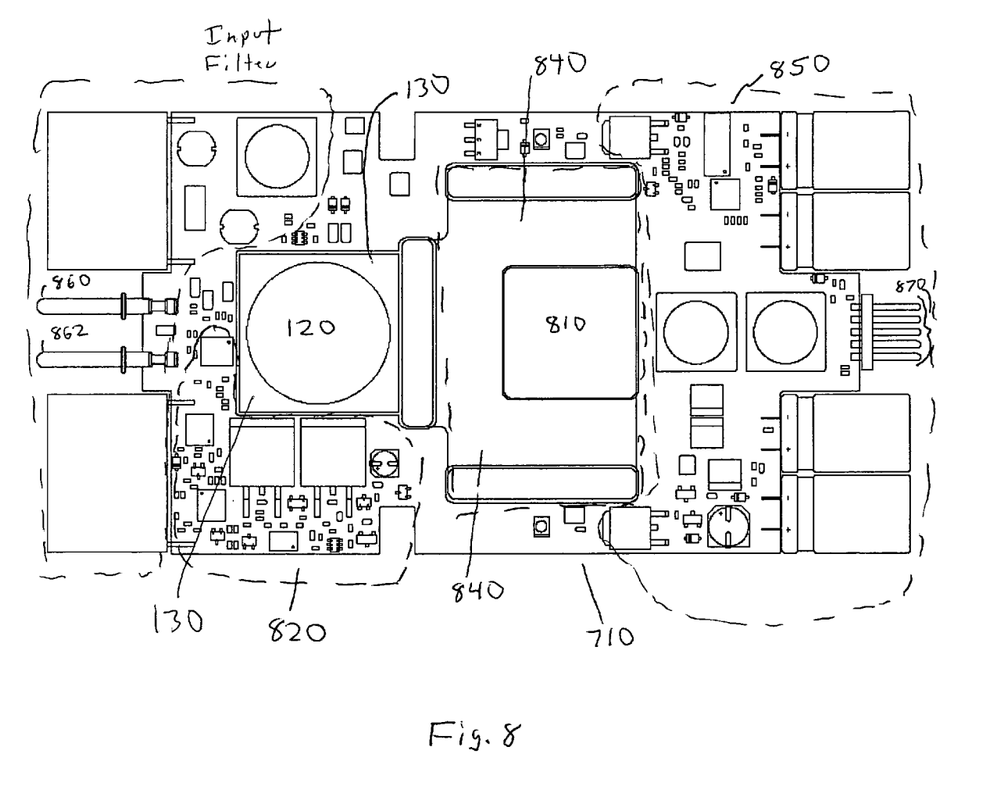
FIG. 8 illustrates a top view of a circuit board in a power converter according to an embodiment of the present invention.

FIG. 8 illustrates a top view of a circuit board in a power converter according to an embodiment of the present invention. Although FIG. 8 is illustrated as a single circuit board, the circuit board 710 may be a multi-layer circuit board where different sections or components reside on different layers of the circuit board 710. For example, the input filter 830 may be on a first layer the power factor control circuitry and switches 820 may be on a second layer, and the planar magnetics 810 of the transformer 840 may reside on multiple layers of the circuit board 710. The circuit board 710 may include an input filter section 830, a fan assembly 120, a fan assembly cutout 130, a power factor control and power switch circuitry 820, a transformer section 840, and a secondary rectification and output regulator section 850. In an embodiment of the invention, the circuit board 710 may include two input terminals 860 and 862 for receiving an AC input voltage or a DC input voltage.

In an embodiment of the invention, the circuit board 710 may include five output terminals 870, as illustrated in FIG. 8. A first terminal of the output terminals 870 may be a reference voltage output; a second terminal of the output terminals 870 may be a reference ground; a third terminal of the output terminals 870 may be an adapter output voltage or Vout; a fourth terminal of the output terminals 870 may be a programming voltage; and a fifth terminal of the output terminals 870 may be a programming voltage for limiting a current. In an embodiment of the invention, the circuit board 710 may include four output terminals 870, e.g., the reference voltage output may be eliminated. In an embodiment of the invention, the circuit board 710 may include two output terminals, e.g., a power terminal and a reference ground terminal. In an embodiment of the invention, the circuit board 710 may include a power terminal, a reference ground terminal, and a reference voltage terminal (and no programming voltage terminals). In an embodiment of the invention, the input and output terminals may reside on the same side of the circuit board 710, e.g., on the right side of the circuit board. In an embodiment of the invention, as illustrated in FIG. 8, the input terminal may be on one side, e.g., the left side, and the output terminal may be on a side opposite to the first side, e.g., the right side.

In the embodiment of the invention illustrated in FIG. 8, the fan assembly 120 may be located on a left side of the circuit board 710. In an embodiment of the invention, the fan assembly 120 may be located in the center of the board, e.g., the center lengthwise and widthwise. In the embodiment of the invention illustrated in FIG. 8, the fan assembly 120 may located in close proximity to the power factor control and power switches section 820 and the transformer section 840 because the power factor control and power switches section 820 and the transformer section 840 generate a large amount of the heat in the power converter 100. By placing the fan assembly 120, and hence the cutout 130 of the power adapter 100 in close proximity to these large heat generating areas or sections, the fan assembly 120 moves air past the surface of the adapter body case or core housing 110 above or below the higher heat components in the power adapter with fan assembly 100.

Figure 8A:
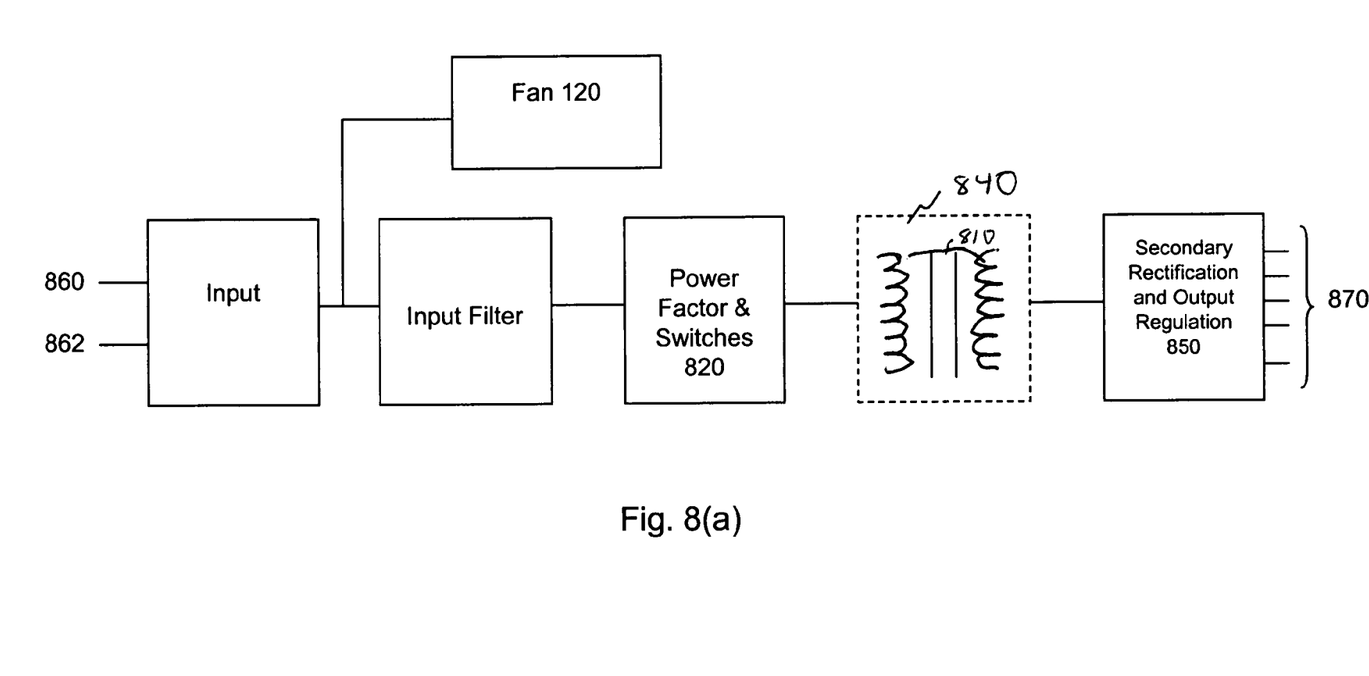
FIG. 8(a) illustrates a block diagram of a circuit board according to an embodiment to the present invention.

In an embodiment of the invention illustrated in FIG. 8, the fan assembly 120 may be located on an opposite side of the transformer section 840 from the secondary rectification and output regulation section 850. In other words, the fan assembly 120 and the secondary rectification and output regulation section 850 are on opposite sides of the circuit board 710, e.g., left side versus right side. The fan assembly 120 may generate high frequency noise within the power adapter with fan assembly 100. In order to eliminate or minimize the transfer of high frequency noise to the secondary rectification and output regulation section 850, the fan assembly 120 may be isolated from the secondary rectification and regulation section 850 by the isolation transformer section 840. FIG. 8(*a*) is a block diagram that illustrates isolation of the fan assembly 120 from the secondary regulation section 850 by use of the isolation transformer section 840. The fan assembly 120 may receive power off of the input. The fan assembly 120 may receive power from the input filter (not shown).

The power adapter with a fan assembly receives an AC or DC input voltage and provides a regulated voltage and controlled current output to an electronic device or a plurality of electronic devices. In an embodiment of the invention, the regulated voltage and the controlled current output are input to an error correction system or output regulation system 850 (see FIG. 8). In embodiments of the invention, the output regulation system may also receive a programming signal. The magnitude of the programming signal may be dependent upon a value of a resistor located in a cable coupled to the power adapter with the fan assembly 100. In an embodiment of the invention, the magnitude of the programming signal may be dependent upon a value of a resistor located in a connector coupled to the cable and the power adapter with the fan assembly. In an embodiment of the invention, one or more resistors may be installed in one of the cable and the connector. The installation of the one or more resistors in the one of the cable and the connector and the coupling of the cable or the cable and the connector, may change the magnitude of the programming signal to be transmitted to the output regulation system.

Illustratively, the one or more resistors may be coupled between a line in the cable or connector coupled to voltage program input and a line in the cable or connector coupled to ground. Illustratively, the one or more resistors may be coupled between a line in the cable or connector coupled to current program input and a line in the cable or connector coupled to ground. Illustratively, a first resistor may be coupled between a reference output and ground and a second resistor may be coupled between voltage program input and ground. This may produce a different magnitude of the programming signal because the first resistor may be coupled in parallel with a pullup resistor in the power adapter, which may modify the resistance value. Descriptions of the resistors utilized within the cable and the connector are found in the following patents, the disclosures of which are incorporated herein by reference: U.S. Pat. No. 5,838,554, entitled "Improved Small Form Factor Power Supply;" U.S. Pat. No. 5,949,213, entitled "Method and System for Recharging Batteries;" U.S. Pat. No. 6,172,884, entitled "Programmable Power Supply;" and U.S. Pat. No. 6,266,261, entitled "DC Power Adapter System."

Alternatively, a programming signal may be transmitted from an active device in the cable or from an active device in the connector. The active device may be, for example, a controller or an operational amplifier. The active device may transmit the programming signal to the output regulation system 850. The active device may receive a voltage reference signal from the power adapter with fan assembly 100. Further discussion of such active devices are provided in the following patent applications, the disclosures of which are incorporated by reference: U.S. patent application Ser. No. 10/313,662, filed May 30, 2003, entitled "Active Tip", and U.S. patent application Ser. No. 10/313,793, filed Dec. 6, 2002, entitled "Programmable Tip."

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A power adapter comprising:
a housing, including a fan assembly to draw air;
a first plate coupled to the housing to create a first air channel between the first plate and the housing; and
a second plate coupled to the housing to create a second air channel between the second plate and the housing, wherein the fan assembly moves air through the first air channel and draws the air through the second air channel and the fan assembly before the air is moved through the first air channel.

2. The power adapter of claim 1, wherein the first plate and the second plate are formed of plastic.

3. The power adapter of claim 1, wherein the first plate and the second plate are connected to the housing via posts.

4. The power adapter of claim 1, wherein a transformer section in the housing utilizes planar magnetics.

5. The power adapter of claim 1, further including an input port for receiving power from a power source and an output port for transmitting power to an electronic device.

6. A power adapter, comprising:
a housing, the housing including a cutout, said cutout being a hole cut through the housing; and a fan assembly, located in the cutout of the housing, and coupled to the housing;
a plate coupled to the housing to create a plenum between the plate and the housing; and
a second plate coupled to the housing to create a second plenum between the second plate and the housing, wherein the fan assembly draws air in through the plenum and moves the air through the second plenum.

7. A power adapter, comprising:
a housing, the housing including
a circuit board including a plurality of input terminals for receiving power from an input power source and a plurality of output terminals, a number of the plurality of output terminals for outputting power to an electronic device and at least one of the plurality of output terminals for outputting a reference voltage; and
a fan assembly electrically coupled to the circuit board;
a first plate coupled to the housing to create a first air channel between the first plate and the housing; and
a second plate coupled to the housing to create a second air channel between the second plate and the housing, wherein
the fan assembly moves air through the first air channel to cool a temperature of the cower adapter, and the fan assembly draws air through the second air channel before moving the air through the first air channel.

8. The power adapter of claim 7, wherein a heat dissipating device is attached to the circuit board to dissipate heat generated by components of the circuit board across a surface of the heat dissipating device.

9. The power adapter of claim 8, wherein the heat dissipating device is approximately the length and width of the circuit board.

10. The power adapter of claim 7, further including at least one heat dissipating device coupled to the at least one high heat-generating component of the circuit board.

11. The power adapter of claim 10, further including a second heat dissipating devices, having a similar length and width approximate to a length and width of the circuit board, that is coupled to the at least one heat dissipating device.

12. A power adapter, comprising:
a housing, including
a circuit board coupled to an input port and an output port,
an adapter portion,
a second adapter portion that is coupled to the adapter portion to form the housing, and
a cutout forming a hole in the adapter portion, the second adapter portion, and the circuit board, and
a fan assembly, located in the cutout of the housing, and coupled to the housing,
a plate coupled to the housing to create a first plenum between the plate and housing; and
a second plate coupled to the housing to create a second plenum between the second plate and the housing, wherein
the fan assembly draws air in through the first plenum and moves air through the second plenum.

13. The power adapter of claim 12, wherein the adapter portion includes a ledge and the second adapter portion includes a second ledge, and the ledge and the second ledge contact the fan assembly to keep the fan assembly from moving during operation.

14. The power adapter of claim 12, wherein the ledge includes at least one protrusion and the second ledge includes at least one receptacle, so that when the adapter portion and the second adapter portion are pressed together to contact the fan assembly, the at least one protrusion engages the at least one receptacle.

* * * * *